United States Patent
Yu et al.

(10) Patent No.: US 10,643,685 B1
(45) Date of Patent: May 5, 2020

(54) CONTROL CIRCUIT, SAMPLING CIRCUIT FOR SYNCHRONOUS DYNAMIC RANDOM-ACCESS MEMORY, METHOD OF READING PROCEDURE AND CALIBRATION THEREOF

(71) Applicant: Realtek Semiconductor Corporation, Hsinchu (TW)

(72) Inventors: Chun-Chi Yu, Zhubei (TW); Gerchih Chou, San Jose, CA (US); Chih-Wei Chang, Hsinchu County (TW); Shen-Kuo Huang, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/177,603

(22) Filed: Nov. 1, 2018

(51) Int. Cl.
   *G11C 8/18*      (2006.01)
   *G11C 11/4076*   (2006.01)
   *G11C 11/409*    (2006.01)

(52) U.S. Cl.
   CPC ........ *G11C 11/4076* (2013.01); *G11C 11/409* (2013.01)

(58) Field of Classification Search
   CPC ...... G11C 11/4076; G11C 11/409; G11C 8/18
   See application file for complete search history.

(56) References Cited

U.S. PATENT DOCUMENTS

| | | | |
|---|---|---|---|
| 8,773,926 B2 * | 7/2014 | Hunt | G11C 7/1066 365/193 |
| 9,135,980 B2 | 9/2015 | Yu et al. | |
| 2008/0005518 A1 * | 1/2008 | Gillingham | G06F 13/4243 711/167 |
| 2009/0244997 A1 * | 10/2009 | Searles | G11C 7/1051 365/194 |
| 2010/0246290 A1 * | 9/2010 | MacLaren | G11C 7/1051 365/193 |
| 2011/0128793 A1 * | 6/2011 | Venkataraman | G06F 13/1689 365/189.02 |
| 2012/0307577 A1 * | 12/2012 | Sriadibhatla | G11C 29/023 365/193 |
| 2013/0208553 A1 | 8/2013 | Hunt et al. | |
| 2014/0355359 A1 * | 12/2014 | Linam | G11C 7/222 365/189.02 |

(Continued)

FOREIGN PATENT DOCUMENTS

| CN | 102637155 A | * | 8/2012 |
|---|---|---|---|
| CN | 104424984 A | | 3/2015 |

(Continued)

*Primary Examiner* — Mushfique Siddique

(74) *Attorney, Agent, or Firm* — Locke Lord LLP; Tim Tingkang Xia, Esq.

(57) ABSTRACT

The present disclosure provides a memory control circuit configured to precede a data-reading process with a memory. For the data-reading process, the memory transmits a DQ and a DQS indicating a time to read the DQ. The DQS includes a preamble. The memory control circuit includes a control circuit and a sampling circuit. The control circuit is configured to generate an enabling signal. The sampling circuit coupled to the control circuit is configured to sample the DQS based on the enabling signal in order to determine a sampling level. The control circuit determines whether the sampling level matches a signal level of the preamble or not.

18 Claims, 7 Drawing Sheets

(56) References Cited

U.S. PATENT DOCUMENTS

| | | | | |
|---|---|---|---|---|
| 2015/0049562 A1* | 2/2015 | Yu | ................. | G11C 11/4076 365/193 |
| 2015/0186328 A1* | 7/2015 | Bonen | ................. | G11C 29/028 710/105 |
| 2016/0049183 A1* | 2/2016 | Bose | ................. | G06N 20/00 365/193 |

FOREIGN PATENT DOCUMENTS

| | | | | |
|---|---|---|---|---|
| EP | 2036090 A1 * | 3/2009 | ......... | G06F 13/4243 |
| TW | I521508 B | 2/2016 | | |

\* cited by examiner

CONTROL CIRCUIT, SAMPLING CIRCUIT FOR SYNCHRONOUS DYNAMIC RANDOM-ACCESS MEMORY, METHOD OF READING PROCEDURE AND CALIBRATION THEREOF

BACKGROUND

Field of Invention

The disclosure relates to a control circuit. More particularly, the disclosure relates to a memory control circuit and a calibration method.

Description of Related Art

When reading data in the double data rate synchronous dynamic random-access memory (DDR SDRAM) or the Low Power DDR (LPDDR), the memory will transmit data signals (DQ) and DQ strobe (DQS) to the controller. Hence, it the controller uses the read latency of the memory to operate its enabling signal (DQS enable signal), there will be different clock domains and cause reading errors.

SUMMARY

The disclosure provides a memory control circuit. A DQS includes a preamble. The memory control circuit includes a control circuit and a sampling circuit. The control circuit is configured to generate an enabling signal. The sampling circuit coupled to the control circuit is configured to sample the DQS based on the enabling signal in order to determine a sampling level. The control circuit determines whether the sampling level matches a signal level of the preamble or not.

The disclosure also provides a calibration method. The control method includes following operations. Generates an enabling signal by a control circuit. Sampling the DQS based on the enabling signal by a sampling circuit in order to determine a sampling level. Determining by a control circuit whether the sampling level matches a signal level of the preamble or not.

DETAILED DESCRIPTION

Figure 1:
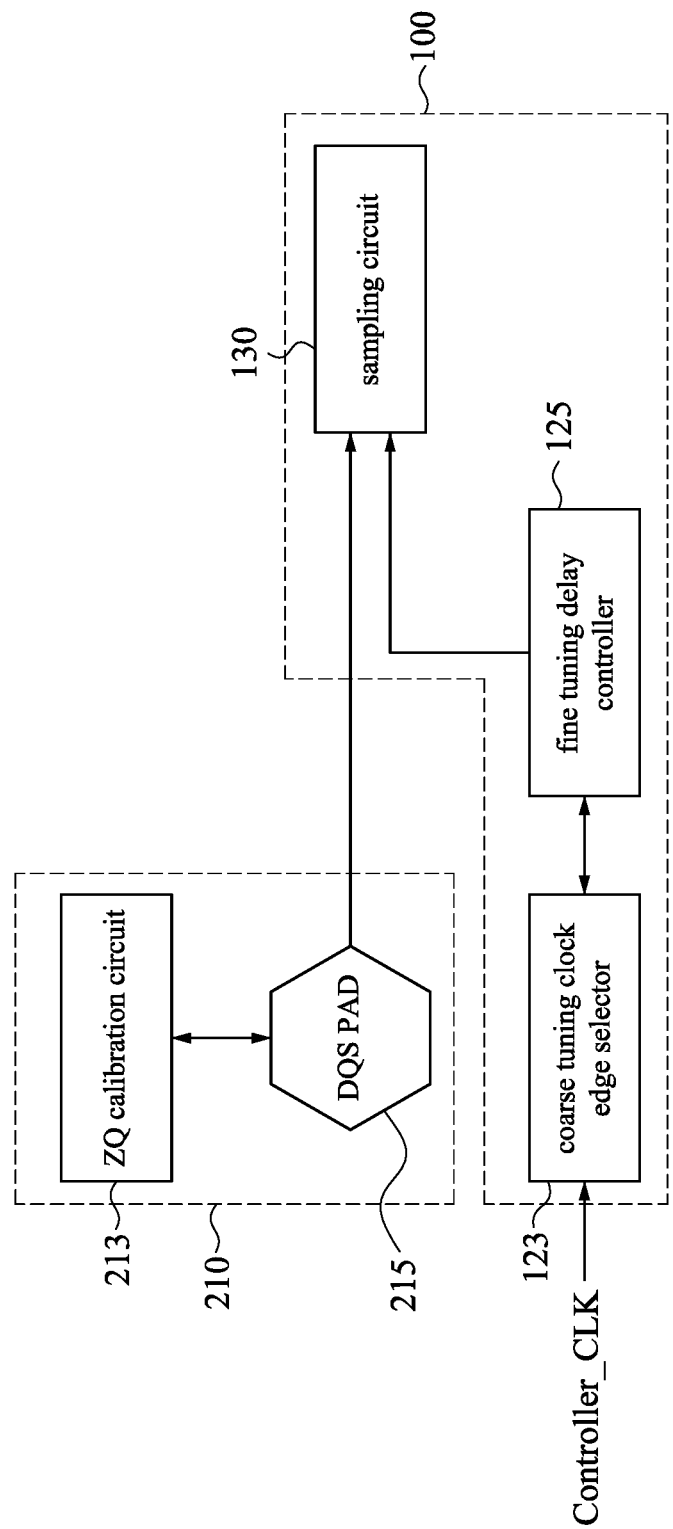
FIG. 1 is a functional block diagram illustrating to provide clocks to a sampling circuit according to an embodiment of this disclosure.

Please refer to FIG. 1, which illustrates a functional block diagram illustrating to provide clocks to a sampling circuit 130 according to an embodiment of this disclosure. A memory 210 includes a ZQ calibration circuit 213 and a DQS (DQ Strobe) PAD 215. The ZQ calibration circuit 213 is configured to output a calibrating impedance to the DQS PAD 215. The DQS PAD 215 adjusts clock cycles based on the calibrating impedance, in order to transmit a DQS signal to the sampling circuit 130.

A memory control circuit 100 includes a coarse tuning clock edge selector 123 and a fine tuning delay controller 125. The coarse tuning clock edge selector 123 generates a coarse tune clock which is one or multiple times of a clock signal Controller_CLK, and transmits the coarse tune clock to the sampling circuit 130. The sampling circuit 130 samples based on the coarse tune clock. The fine tuning delay controller 125 is configured to generate a delay time which is less than the coarse tune clock. The delay time is set as a fine tune clock and transmitted to the sampling circuit 130. The clock signal Controller_CLK may be one clock cycle (1T). In one embodiment, the delay time is smaller than 1T (e.g. T/16). Then, the sampling circuit 130 samples signals based on fine tune clock.

Figure 2:
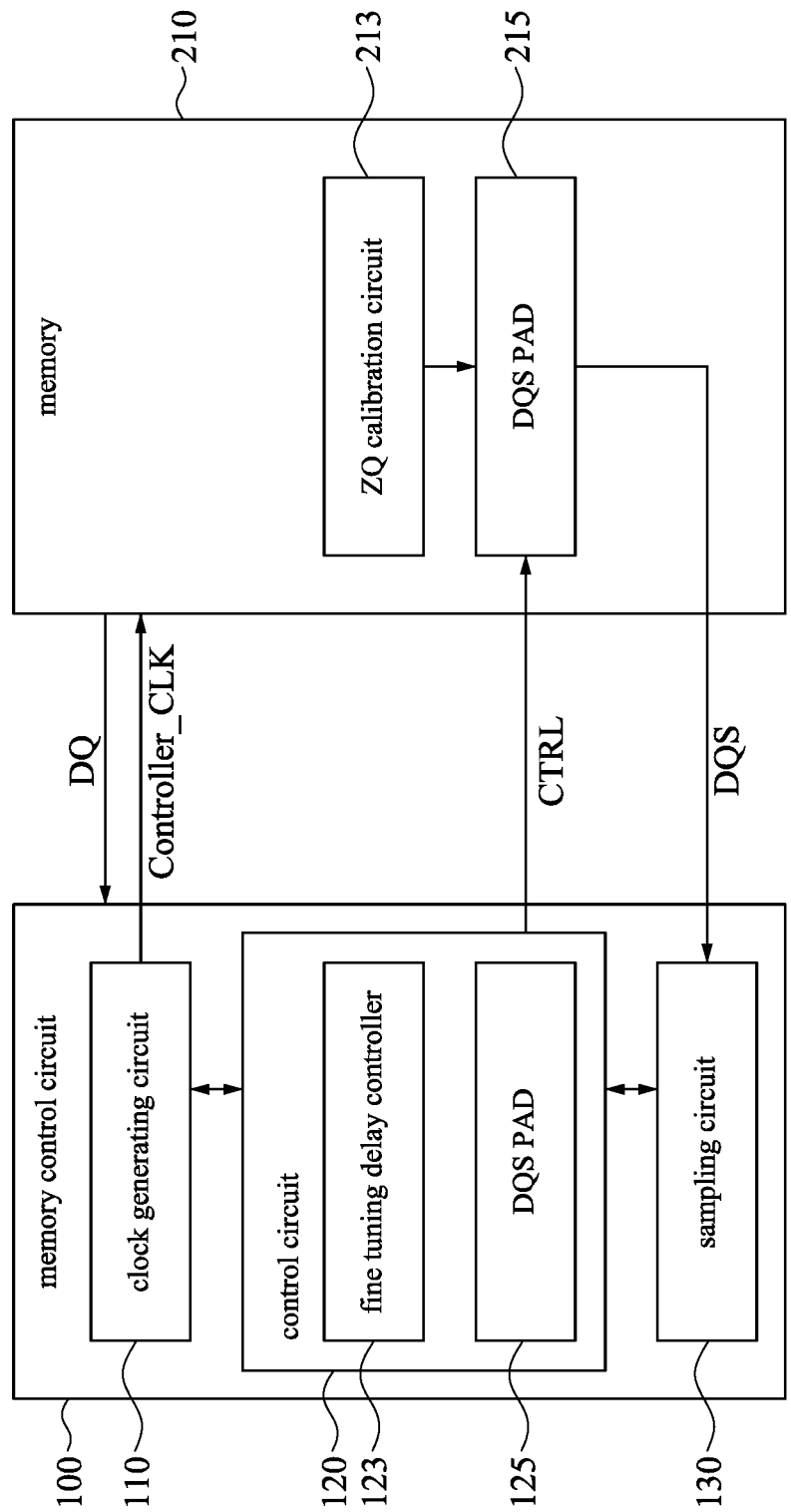
FIG. 2 is a functional block diagram illustrating a memory control circuit and a memory according to an embodiment of the disclosure.

Please refer to FIG. 2, which illustrates a functional block diagram illustrating the memory control circuit 100 and the memory 210 according to an embodiment of the disclosure. The memory 210 includes the ZQ calibration circuit 213 and the DQS PAD 215. The memory control circuit 100 is configured to process a reading data procedure with the memory 210. In the reading data procedure, the memory 210 transmits a DQ signal and a DQ strobe (DQS) signal to the memory control circuit 100. The DQS signal indicates the time to present the DQ signal. The DQS signal includes a preamble. The preamble is configured to point out the memory control circuit 100 to read the DQ signal.

The memory control circuit 100 includes a clock generating circuit 110, a control circuit 120, and sampling circuit 130. The clock generating circuit 110 is configured to generate a clock signal Controller_CLK of the memory control circuit 100. The control circuit 120 is coupled to the clock generating circuit 110. The sampling circuit 130 is coupled to the control circuit 120. The control circuit 120 is configured to generate an enabling signal based on the clock Controller_CLK. The sampling circuit 130 is configured to sample the DQS signal based on the enabling signal to obtain a sampling level. The control circuit 120 determines whether a signal level of each sampled signal matches a fixed level, in order to determine a signal position currently sampled.

Figure 3A:
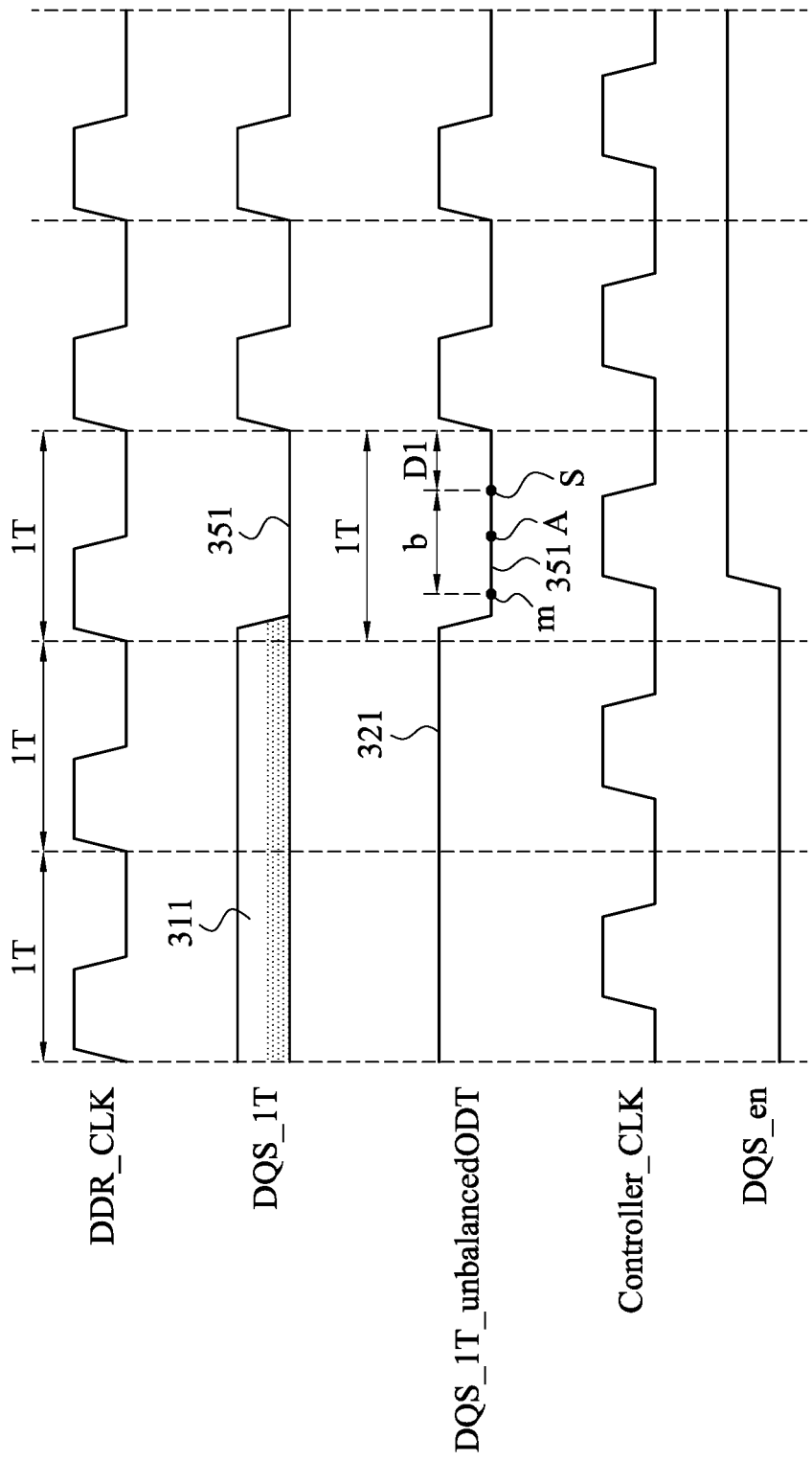
FIG. 3A to FIG. 3B are signal waveform diagrams according to an embodiment of the disclosure.

Please refer to FIG. 3A, which illustrates a signal waveform diagram according to an embodiment of the disclosure. Please refer to FIG. 2 and FIG. 3A, the memory 210 processes operations based on a clock signal DDR_CLK. The DQS signal DQS_1T and DQS_1T_unbalancedODT is the clock signal to indicate the position in each clock to read the DQ signal. The memory control circuit 100 processes operations based on the clock signal Controller_CLK. The sampling circuit 130 samples signals based on an enabling signal DQS_en. In the embodiment of the signal waveform, a preamble 351 is at one signal level (Static DQS Preamble). For example, the preamble 351 is the low signal with about one clock cycle (1T).

In general, the front end of the DQS signal (may be several cycles) is a tristate portion and the preamble portion in order. As shown in FIG. 3A, the signal DQS_1T has the tristate portion 311 (the gray part) with 2T clock cycles. The tristate portion 311 is the signal having three different signal types, and the tristate portion 311 shows different signals at each time point due to these different signal types. To sample the signal DQS_1T, it is difficult to determine whether the sampled signal is the preamble 351 or not. For example, to determine the front end of the signal DQS signal_1T, if the random signal level of the tristate portion 311 is the same with that of the preamble 351, there will be a mistake that taking the tristate portion 311 for the preamble 351, and leading to processing the reading data procedure at false clocks such that the data cannot be read correctly.

Figure 4:
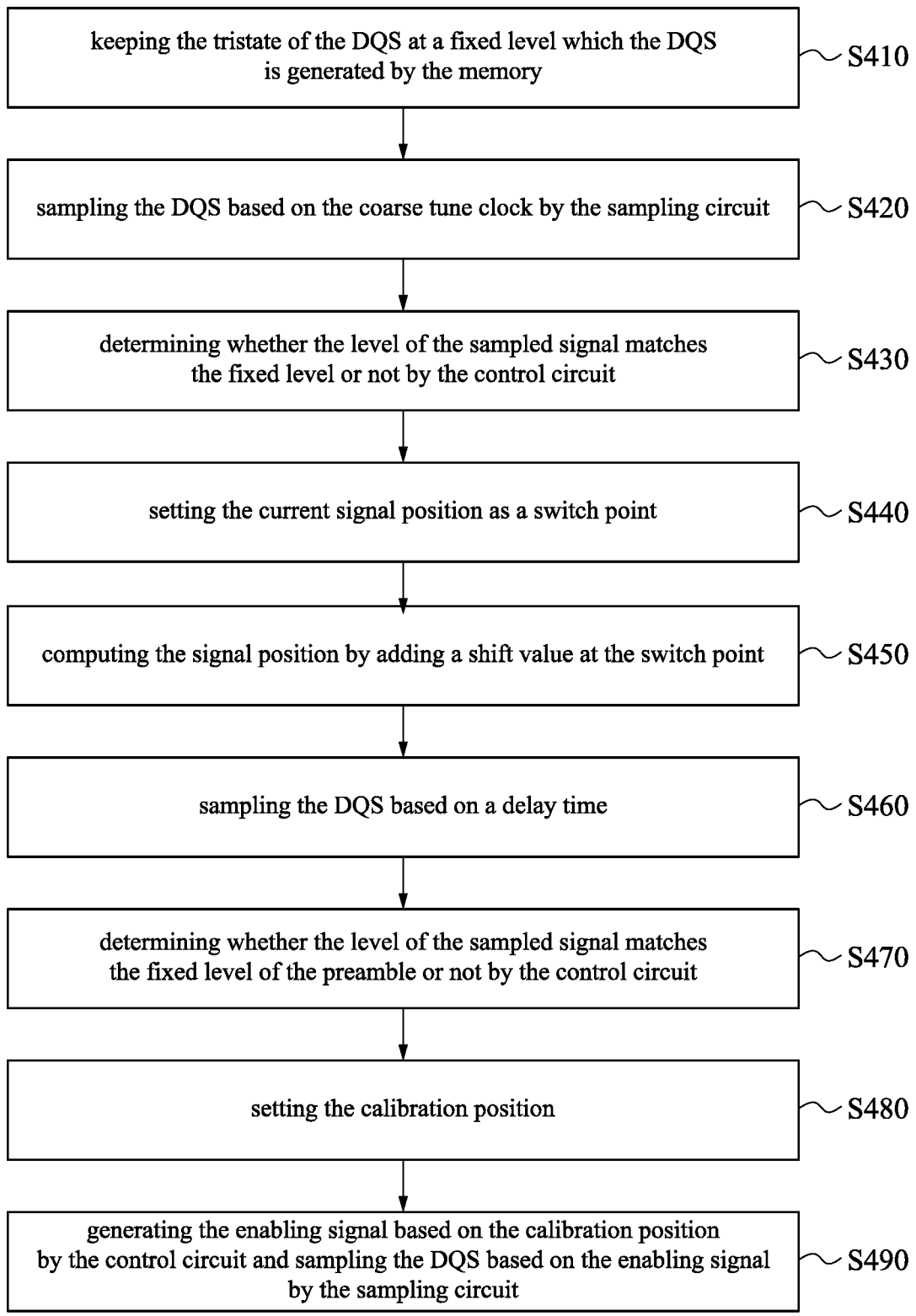
FIG. 4 is a flow diagram illustrating a coarse tune procedure and a fine tune procedure according to an embodiment of the disclosure.

Please refer to FIG. 4, which illustrates a flow diagram illustrating a coarse tune procedure and a fine tune procedure according to an embodiment of the disclosure. Please refer to the signal wave form of FIG. 3A. In order to determine whether the sampled signal is the preamble 311 or not, in step S410, maintaining the tristate portion 311 of the signal DQS_1T to the fixed level such as high level. After fixing the level, the signal DQS_1T_unbalancedODT is obtained.

The method to maintain the tristate portion 321 at the fixed level is showed as FIG. 2, the control circuit 120 transmits a control signal CTRL to the DQS PAD 215. The DQS PAD 215 sets two resistances of two sides of the DQS signal (not shown) and two resistances of two sides of the DQS # signal (not shown) as two different resistances respectively according to the control signal CTRL (such as the two resistances of the DQS signal are 100 ohm and 50 ohm, the two resistances of the DQS # signal are 50 ohm and 100 ohm), wherein the DQS # signal and the DQS signal are differential signals. By modifying the impedance matching state of the DQS signal and DQS # signal, there is a voltage difference between the DQS signal and the DQS # signal, and the tristate portion 321 can maintain at the high level or the low level.

In step S420, the sampling circuit 130 samples the signal DQS_1T_unbalancedODT based on the coarse tune clock generated by the coarse tuning clock edge selector 123. For example, the clock signal Controller_CLK is 1T, then the coarse tune clock will be set at 0.5T, and the sampling procedure begins at the tristate portion 321 of the signal DQS_1T_unbalancedODT with 0.5T clock.

In step S430, at each coarse tune clock in the sampling procedure, the control circuit 120 determines whether a signal level sampled by the sampling circuit 130 matches the fixed level or not. For instance, the tristate portion 321 is high level, if the control circuit 120 determines the sampled signal is high level, it means that the sampled point is still in the range of the tristate portion 321, the control circuit 120 should continue sampling with the coarse tune clock.

If the signal level of the sampled signal is different from the signal level of the previous sampled signal, it means that the sampled point is in the range of the preamble 351 after sampling several times with one or more coarse tune clocks. In step S440, setting the signal position currently sampled as a switch point m, as shown in FIG. 3A. In the step, the part of the preamble 351 is already known, then the resistances of the two sides of the DQS signal and DQS # signal will set to be at the same resistance. The purpose of this step is to prevent influencing the accuracy when sampling the DQS signal (DQS duty).

In one embodiment, the memory control circuit 100 may but not limited to use 0.5T clock cycle as the coarse tune clock.

Figure 3B:
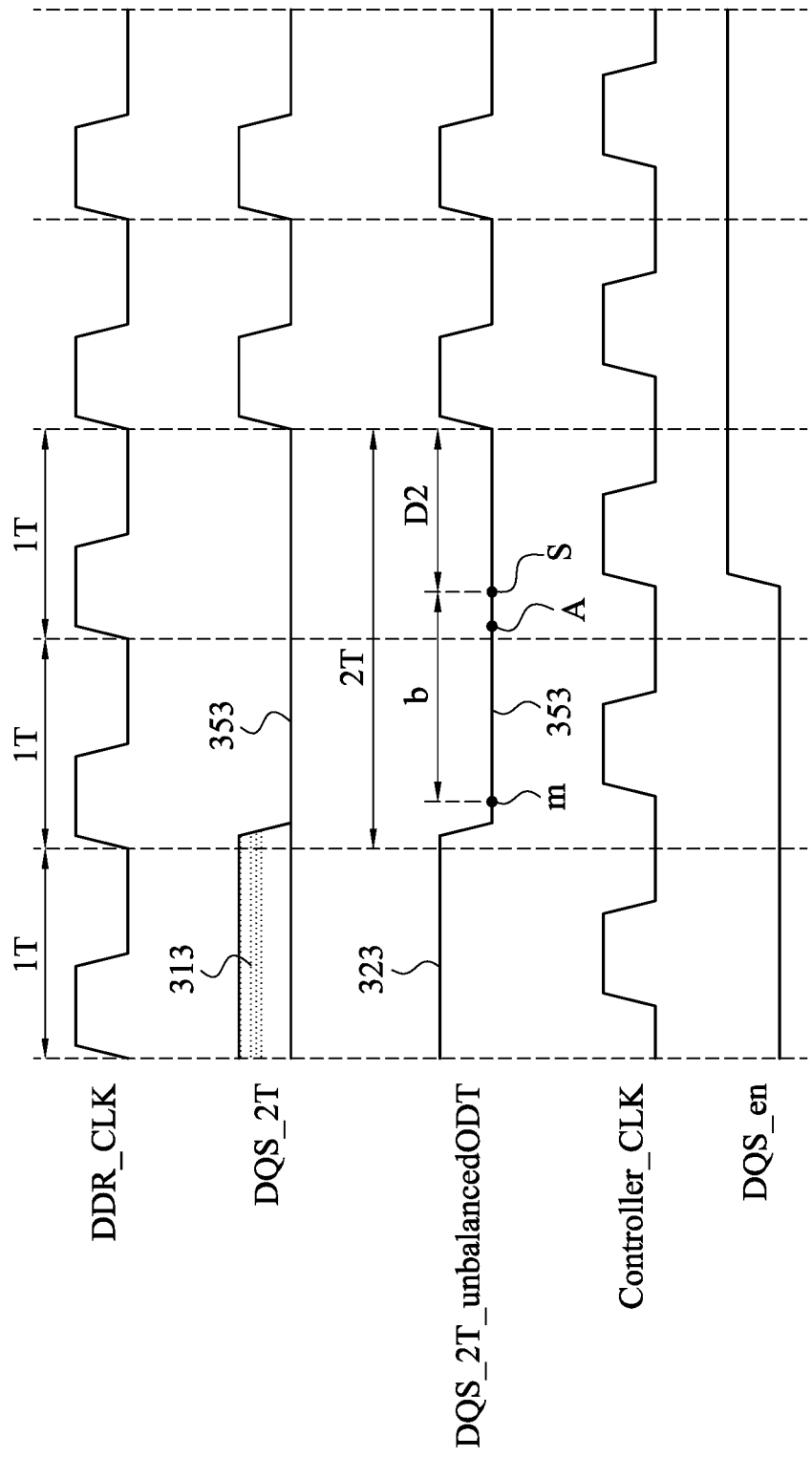

Please refer to FIG. 3B, which illustrates a signal waveform diagram according to an embodiment of the disclosure. The same symbols have the same operations as illustration in FIG. 3A and FIG. 3B. Please refer to FIG. 2 and FIG. 3B, the DQS signal DQS_2T and DQS_2T_unbalancedODT is the clock signal to indicate the position in each clock to read the DQ signal. The preamble 353 is at one signal level. For example, the preamble 353 is the low signal with about two clock cycles (2T).

In the embodiment, the tristate portion 313 (the gray part) of the signal DQS_2T is about 1T clock cycle. Similar with the steps S410 to step S440 in FIG. 4, the switch point m of the signal DQS_2T_unbalancedODT can be obtained.

In one embodiment, the memory control circuit 100 may but not limited to use 1T clock cycle as the coarse tune clock.

In the following steps in FIG. 4 are about the fine tune procedure. Please refer to FIG. 3A and FIG. 4. In step S450, setting one shift value b at first, and adding the shift value b to the switch point m, and obtaining the signal position m+b (i.e. the signal position S in FIG. 3A). In one embodiment, the shift value b can be 0.5T clock cycle. In step S460, from the signal position S, sampling the signal DQS_1T_unbalancedODT according to a delay time d by the sampling circuit 130. The sampling procedure is such as the first fine tune position m+b+d, the second fine tune position m+b+2d, and so on.

In step S470, determining whether the signal level of the fine tune sampled position matches the signal level of the preamble 351. If matching, it means that the sampled point is in the range of the preamble 351, and the method will go back to step S460. If the sampled signal level is different with that of the preamble 351, it means that the signal position currently sampled is near an up edge of the range of the preamble 353 after several times for the fine tune procedure. After n1 times for the fine tune procedure and each sampling interval is a delay time d, a total delay time is D1 (i.e. length d×n1). Therefore, the position that adds the total delay time D1 to the signal position S is the signal position m+b+D1.

Then, in step of calculating a calibration position, in the embodiment that the preamble 351 is low level signal with about 1T, as illustration in step S480, the method will set the position that adding the total delay to the switch point m, as the calibration position A. For example, the signal DQS_1T_unbalancedODT in FIG. 3A, the final sampled signal position is m+b+D1. Because the delay time d (e.g. 1T/16) is smaller than the clock cycle (1T), that is the fine tune procedure takes smaller time interval to perform sampling, the final sampled signal position m+b+D1 will be near to the next pulse of the preamble 351. Half length of the preamble 351 is 0.5T. Then, calculating the signal position m+b+D1−0.5T as a (near) middle position of the preamble 351, and setting the position as the calibration position A. When the shift value b is 0.5T, substituting the shift value b into the formula and the calibration position A is the position m+D1.

In step S490, the control circuit 120 generates an enabling signal DQS_en according to the calibration position A. The sampling circuit 130 performs the reading procedure according to the enabling signal DQS_en.

In another embodiment, the signal DQS_2T_unbalancedODT in FIG. 3B operates the steps in FIG. 4 are the similar illustration above. In the embodiment, the preamble 353 is the low level signal with about 2T, and the next clock near the preamble 353 is the position m+b+D2. The method will subtract 1T (i.e. half length of the preamble 353) from the position m+b+D2, and the signal position m+b+D2−1T is the (near) middle position of the preamble 351. When the shift value b is 1T, substituting the shift value b into the formula and the calibration position A is the position m+D2. The control circuit 120 calibrates the enabling signal DQS_en to the calibration position A. The sampling circuit 130 performs the reading procedure according to the enabling signal DQS_en.

Figure 5A:
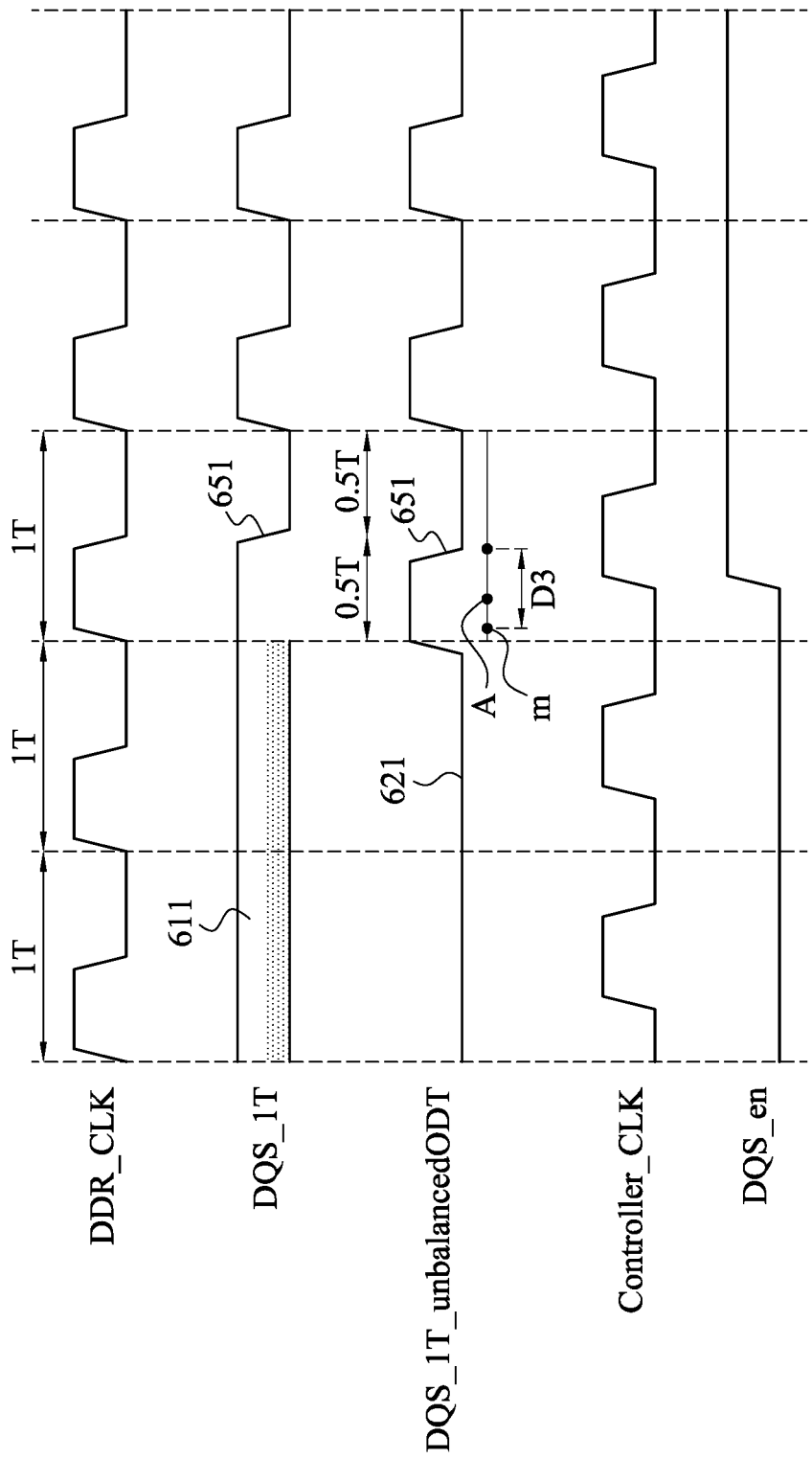
FIG. 5A to FIG. 5B are signal waveform diagrams according to an embodiment of the disclosure.

Please refer to FIG. 5A, which illustrate a signal waveform diagram according to an embodiment of the disclosure. The signal level of the preamble 651 of the signal DQS_1T and DQS_1T_unbalancedODT have various levels (Togglling DQS Preamble). For example, the preamble 651 has high level signal with about 0.5T and low level signal with about 0.5T.

The signal waveform shown in FIG. 5A can be used in the coarse tune procedure in FIG. 4, and the illustration is similar. After coarse tune with 0.5T in the signal DQS_1T_unbalancedODT and sampling, the switch point m can be obtained, and the fine tune procedure of step S450 to step S470 are similar above. In one embodiment, the shift value b may be but not limited to 0.5T clock cycle.

In step S480, if the middle position of 0.5T high level signal is the desired value, subtracting 0.25T from the position near the down edge of the low level signal of the preamble 651. In step S482, the control circuit 120 calculates the position m+D3−0.25T by adding the total delay time D3 (i.e. d×n3) to and subtracting 0.25T to the switch point m. Therefore, the calibration position A is the position m+D3−0.25T.

Figure 5B:
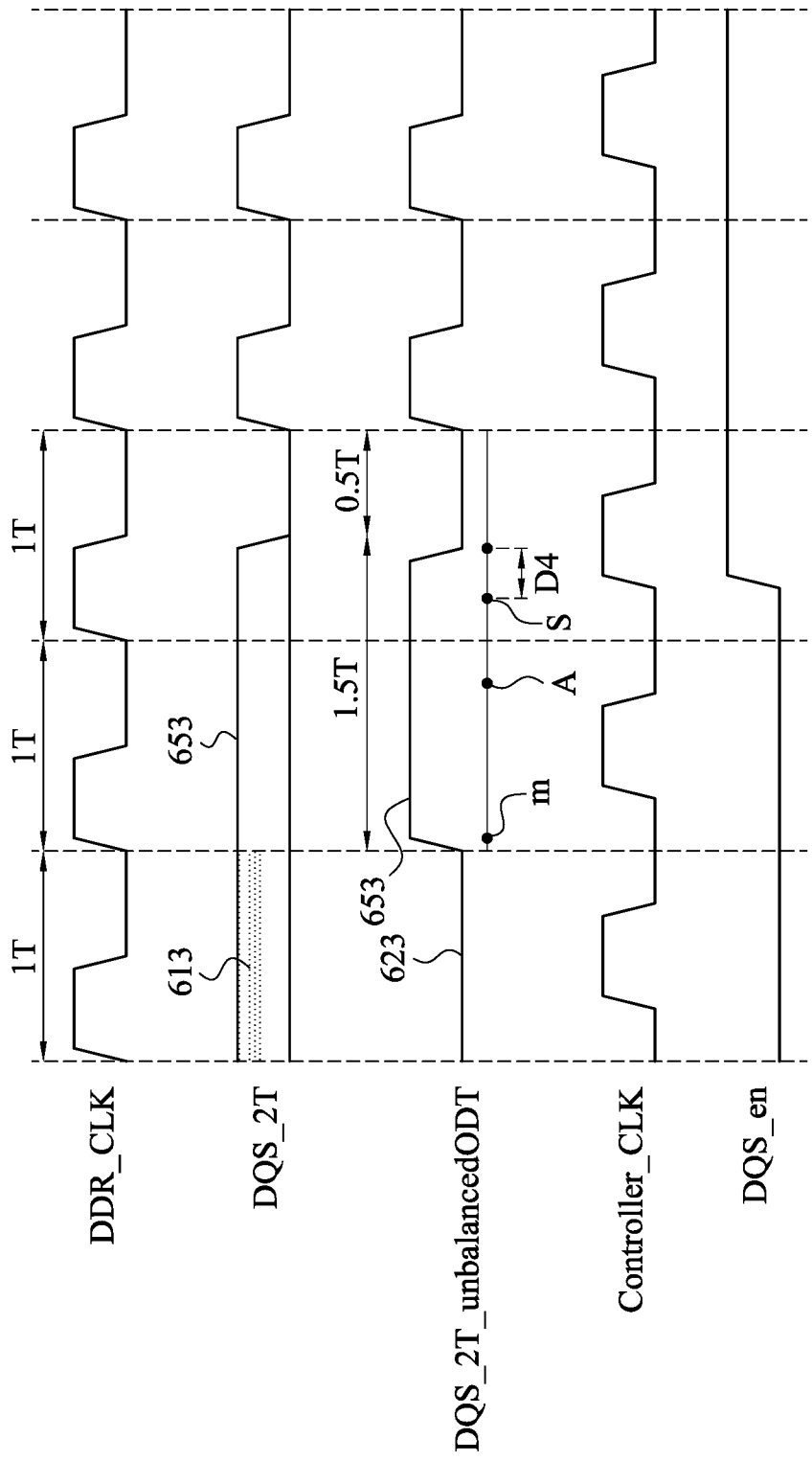

Please refer to FIG. 5B, which illustrate a signal waveform diagram according to an embodiment of the disclosure. The signal level of the preamble 653 of the signal DQS_2T and DQS_2T_unbalancedODT have various levels. For example, the preamble 653 has high level signal with about 1.5T and low level signal with about 0.5T.

The signal waveform shown in FIG. 5B can be used in the fine tune procedure in FIG. 4, and the illustration is similar. After coarse tune with 1T in the signal DQS_2T_unbalancedODT and sampling, the switch point m can be obtained, and the fine tune procedure of step S450 to step S470 are similar above. In one embodiment, the shift value b may be but not limited to 1T.

In step S480, if the middle position of 1.5T high level signal is the desired position to fetch, subtracting 0.75T from the position near the down edge of the low level signal of the preamble 653. In step S483, the control circuit 120 calculates the position m+D4+0.25T by adding the total delay time D4 (I.e. d×n4) and adding 0.25T to the switch point m. Therefore, the calibration position A is the position m+D4+0.25T.

Accordingly, through the coarse tune process the present disclosure can confirm the sampled signal is the range of the preamble of the DQS. Through the fine tune procedure the calibration position for the preamble can be found so as to adjust the enabling signal to the calibration position. Therefore, the present disclosure can achieve the clock calibration and enhance the accuracy for reading data from the memory.

What is claimed is:

1. A memory control circuit for processing a reading data procedure with a memory, wherein the memory transmits a DQ and a DQS indicating presenting time of the DQ in the reading data procedure, wherein the DQS comprises a preamble and a tristate portion followed by the preamble, wherein the memory control circuit comprises:
a clock generating circuit configured to generate a clock;
a control circuit coupled to the clock generating circuit, configured to generate an enabling signal based on the clock, and configured to transmit a control signal to the memory so as to make a signal level of the tristate portion maintain at a fixed level different from a signal level of the preamble; and
a sampling circuit coupled to the control circuit, and configured to sample the DQS to obtain a sampling level based on the enabling signal;
wherein the control circuit determines whether the sampling level matches a signal level of the preamble or not.

2. The memory control circuit of claim 1, wherein the control circuit comprises a coarse tuning clock edge selector, the coarse tuning clock edge selector is configured to output a coarse tune clock, wherein when the sampling level matches the fixed level, the sampling circuit samples the DQS based on the coarse tune clock outputted by the coarse tuning clock edge selector, and determines whether a signal position, which is currently sampled, is in the tristate portion or not.

3. The memory control circuit of claim 2, wherein the control circuit comprise a fine tuning delay controller, the fine tuning delay controller is configured to generate a delay time, the delay time is less than the clock, wherein when the sampling level does not match the fixed level, the control circuit sets the signal position currently sampled as a switch point, wherein the switch point is in the preamble.

4. The memory control circuit of claim 3, wherein the control circuit determines whether a signal level sampled at a position, which is generated by adding a shift value to the switch point, matches the signal level of the preamble, wherein the shift value comprises 0 clock cycle, 0.5 clock cycle, and 1 clock cycle.

5. The memory control circuit of claim 4, wherein if the control circuit determines the signal level sampled at the position, which is generated by adding the shift value to the switch point, matches the signal level of the preamble, the control circuit determines whether the signal level that sampled at the position, which is generated by adding the shift value and the delay time to the switch point, matches the signal level of the preamble or not.

6. The memory control circuit of claim 5, wherein if the control circuit determines the signal level sampled at the position, which is generated by adding the shift value and the delay time to the switch point, does not match the signal level of the preamble, the control circuit calculates a signal position, which is generated by adding a total delay time to the switch point, and sets the signal position as a calibration position of the preamble, wherein the signal level of the preamble is high level signal or low level signal.

7. The memory control circuit of claim 5, wherein the preamble is one clock cycle, wherein half of the clock cycle is in high level and another half of the clock cycle is in low level, and when the control circuit determines that the sampled signal does not match the signal level of the preamble, the control circuit calculates a signal position, which is generated by adding a total delay time to and subtracting a quarter of clock cycle to the switch point, and sets the signal position as a calibration position of the preamble.

8. The memory control circuit of claim 5, wherein the preamble is two clock cycles, wherein one and a half of the clock cycle is in high level and half of the clock cycle is in low level, and when the control circuit determines that the sampled signal does not match the signal level of the preamble, the control circuit calculates the signal position, which is generated by adding a total delay time to and subtracting a quarter of clock cycle to the switch point, and sets the signal position as a calibration position of the preamble.

9. The memory control circuit of claim 4, wherein if the control circuit determines the signal level sampled at the position, which is generated by adding the shift value and the delay time to the switch point, matches the signal level of the preamble, the control circuit controls the sampling circuit to sample the DQS based on the delay time.

10. A calibrating method configured to a reading data procedure between a memory control circuit and a memory, the memory control circuit comprises a clock generating circuit, a control circuit and a sampling circuit, wherein the memory transmits a DQ and a DQS indicating presenting time of the DQ in the reading data procedure, wherein the DQS comprises a preamble and a tristate portion followed by the preamble, wherein the method comprises:

generating a clock by the clock generating circuit;

generating an enabling signal by the control circuit;

transmitting a control signal to the memory by the control circuit so as to make a signal level of the tristate portion maintain at a fixed level different from a signal level of the preamble;

sampling the DQS based on the enabling signal by the sampling circuit to obtain a sampling level; and determining whether the sampling level matches a signal level of the preamble or not by the control circuit.

11. The calibrating method of claim 10, further comprising:

outputting a coarse tune clock by a coarse tuning clock edge selector of the control circuit; and when the sampling level matches the fixed level, the sampling circuit samples the DQS based on the coarse tune clock outputted by the coarse tuning clock edge selector, in order to determine whether a signal position, which is currently sampled, is in the tristate portion or not.

12. The calibrating method of claim 11, further comprising:

generating a delay time by a fine tuning delay controller of the control circuit, and the delay time is less than the clock; and when the sampling level does not match the fixed level, the control circuit sets the signal position currently sampled as a switch point, wherein the switch point is in the preamble.

13. The calibrating method of claim 12, further comprising:

determining whether a signal level sampled at a position, which is generated by adding a shift value to the switch point, matches the signal level of the preamble, wherein the shift value comprises 0 clock cycle, 0.5 clock cycle and 1 clock cycle.

14. The calibrating method of claim 13, further comprising:

if determining the signal level sampled at the position, which is generated by adding the shift value to the switch point, matches the signal level of the preamble, determining whether the signal level that sampled at the position, which is generated by adding the shift value and the delay time to the switch point, matches the signal level of the preamble or not.

15. The calibrating method of claim 14, further comprising:

if determining the signal level sampled at the position, which is generated by adding the shift value and the delay time to the switch point, does not match the signal level of the preamble, calculating a signal position, which is generated by adding a total delay time to the switch point, and setting the signal position as a calibration position of the preamble, wherein the signal level of the preamble is high level signal or low level signal.

16. The calibrating method of claim 14, further comprising:

when the preamble is one clock cycle, and when the control circuit determines that the sampled signal does not match the signal level of the preamble, the control circuit calculates a signal position, which is generated by adding a total delay time to and subtracting a quarter of clock cycle to the switch point, and sets the signal position as a calibration position of the preamble, wherein half of the clock cycle is in high level and half of the clock cycle is in low level.

17. The calibrating method of claim 14, further comprising:

when the preamble is two clock cycles, and when the control circuit determines that the sampled signal does not match the signal level of the preamble, the control circuit calculates the signal position, which is generated by adding a total delay time to and subtracting a quarter of clock cycle to the switch point, and sets the signal position as a calibration position of the preamble, wherein one and a half of the clock cycle is in high level clock cycle and half of the clock cycle is in low level clock cycle.

18. The calibrating method of claim 13, further comprising:

if determining the signal level sampled at the position, which is generated by adding the shift value and the delay time to the switch point, matches the signal level of the preamble, controlling the sampling circuit to sample the DQS based on the delay time.

* * * * *